(12) United States Patent
Kakiuchi

(10) Patent No.: US 7,019,418 B2
(45) Date of Patent: Mar. 28, 2006

(54) POWER CONTROL CIRCUIT WITH REDUCED POWER CONSUMPTION

(75) Inventor: Takashi Kakiuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/071,348

(22) Filed: Mar. 4, 2005

(65) Prior Publication Data

US 2005/0151579 A1    Jul. 14, 2005

Related U.S. Application Data

(63) Continuation of application No. PCT/JP03/02636, filed on Mar. 6, 2003.

(51) Int. Cl.
*H03K 4/02* (2006.01)

(52) U.S. Cl. .................. 307/126; 327/427; 327/436; 327/530

(58) Field of Classification Search ............. 327/427, 327/436, 437, 530; 307/126, 130
See application file for complete search history.

(56) References Cited

U.S. PATENT DOCUMENTS

| | | | |
|---|---|---|---|
| 5,274,601 A | | 12/1993 | Kawahara et al. |
| 5,724,297 A | * | 3/1998 | Noda et al. .................. 365/226 |
| 6,501,300 B1 | * | 12/2002 | Hatae ........................... 326/93 |
| 6,628,149 B1 | * | 9/2003 | Ajit ............................. 327/108 |
| 6,700,363 B1 | * | 3/2004 | Tachimori .................... 323/313 |
| 2001/0000133 A1 | * | 4/2001 | Noda et al. .................. 365/226 |
| 2002/0036529 A1 | | 3/2002 | Furusawa et al. |
| 2002/0060947 A1 | * | 5/2002 | Hatae .......................... 365/233 |
| 2002/0167350 A1 | * | 11/2002 | Sato et al. ................... 327/540 |
| 2003/0052661 A1 | * | 3/2003 | Tachimori ................... 323/313 |
| 2004/0080340 A1 | * | 4/2004 | Hidaka ........................ 326/83 |
| 2004/0124904 A1 | * | 7/2004 | Wu ............................. 327/427 |
| 2004/0151050 A1 | * | 8/2004 | Ooishi ......................... 365/226 |
| 2004/0257135 A1 | * | 12/2004 | Karaki ........................ 327/199 |

FOREIGN PATENT DOCUMENTS

| | | |
|---|---|---|
| JP | 5-210976 | 8/1993 |
| JP | 6-95752 | 4/1994 |
| JP | 7-212217 | 8/1995 |
| JP | 2002-110920 | 4/2002 |
| JP | 2002-158576 | 5/2002 |

* cited by examiner

*Primary Examiner*—Terry D. Cunningham
(74) *Attorney, Agent, or Firm*—Arent Fox, PLLC

(57) ABSTRACT

A first conductive transistor having a high threshold value and a second conductive transistor having a low threshold value are connected in series between a first actual power supply line supplying a power supply voltage and a virtual power supply line connected to a power supply pin of a circuit block constituted of transistors having a low threshold value. The first and second conductive transistors have polarities which are opposite to each other. A power control circuit turns on the first and second conductive transistors while the circuit block is in operation and turning off the first and second conductive transistors while the circuit block is not in operation. Therefore, subthreshold currents of the first and second conductive transistors can be suppressed. As a result of this, it is possible to reduce power consumption of the semiconductor integrated circuit during its standby period.

6 Claims, 10 Drawing Sheets

| semiconductor integrated circuit | switching element | on-state current | off-state current | well structure | negative voltage source |
|---|---|---|---|---|---|
| 10a (first comparative example) | nMOS | 1 | 1 | twin | unnecessary |
| 10b (second comparative example) | pMOS | 0.3 | 3.9 | twin | unnecessary |
| 10c (third comparative example) | nMOS | 0.96 | 0.36 | triple | necessary |
| 10 (present invention) | nMOS, pMOS | 0.6 | 0.00031 | twin | unneccesary |

Fig. 10

POWER CONTROL CIRCUIT WITH REDUCED POWER CONSUMPTION

CROSS-REFERENCE TO RELATED APPLICATIONS

This application is a continuation of PCT International Patent Application No. PCT/JP03/02636, filed on Mar. 6, 2003, the entire contents of which are incorporated herein by reference.

BACKGROUND OF THE INVENTION

1. Field of the Invention

The present invention relates to a semiconductor integrated circuit having a circuit block constituted of transistors having a low threshold value, to which supply of a power supply voltage is interrupted while it is not in operation.

2. Description of the Related Art

As element structure of a semiconductor becomes finer, a power supply voltage supplied to a semiconductor integrated circuit becomes lower every year. When the power supply voltage becomes lower and a difference between the power supply voltage and a threshold voltage of a transistor becomes smaller, difficulty in turning on the transistor increases and its operating speed decreases. In order to prevent the above problems, the threshold voltage of the transistor is showing a tendency to lower together with the power supply voltage.

Moreover, accompanying microfabrication of the transistor, a leakage current (subthreshold current) of the transistor while it is not in operation has a tendency to increase. The increase in the subthreshold current allows power consumption of the semiconductor integrated circuit to increase during its standby period. Therefore, the increase in the power consumption is a significant problem in portable equipment using batteries.

Recently, the technology called MTCMOS (Multi-Threshold voltage CMOS) has been developed in order to reduce the subthreshold current. This kind of technology is disclosed in, for example, Japanese Patent Application Publication No. Hei 5-210976, Japanese Patent Application Publication No. Hei 7-212217, and so on. According to the MTCMOS technology, the threshold voltage of transistors inside a circuit block requiring high speed operation is set low, and a power supply pin of the circuit block is connected to a power supply line via a switch transistor having a high threshold voltage. The switch transistor is turned on while the circuit block is in operation and turned off while the circuit block is not in operation, to thereby reduce the power consumption during the standby period.

However, when an integration degree of the semiconductor integrated circuit increases accompanying the microfabrication of the element structure of the semiconductor, the power consumption is not reduced enough due to the subthreshold current of the switch transistor, even though the MTCMOS technology is employed. Therefore, it is necessary to further suppress the subthreshold current of the switch transistor.

SUMMARY OF THE INVENTION

It is an object of the present invention to reduce power consumption of a semiconductor integrated circuit during its standby period. More particularly, the object is to reduce the power consumption of the semiconductor integrated circuit during the standby period without complicating its device structure. Further, the object is to reduce the power consumption of the semiconductor integrated circuit during the standby period without increasing its product cost.

According to one aspect of a semiconductor integrated circuit of the present invention, the semiconductor integrated circuit comprises a circuit block constituted of transistors having a low threshold value. A first conductive transistor having a high threshold value and a second conductive transistor having a low threshold value are connected in series between a first actual power supply line supplying a power supply voltage and a virtual power supply line connected to a power supply pin of the circuit block. The first and second conductive transistors have polarities which are opposite to each other. A power control circuit turns on the first and second conductive transistors while the circuit block is in operation and turning off the first and second conductive transistors while the circuit block is not in operation.

Since the first and second conductive transistors turn off while the circuit block is not in operation, supply of the power supply voltage to the circuit block is interrupted. Therefore, the power consumption of the semiconductor integrated circuit during the standby period can be reduced. Moreover, since the second conductive transistor having the low threshold value is connected to the first conductive transistor having the high threshold value in series, increase in on-state resistances of the first and second conductive transistors can be kept to a minimum, and off-state resistances thereof can be increased. Therefore, subthreshold currents of the first and second conductive transistors can be further suppressed. As a result of this, it is possible to further reduce the power consumption of the semiconductor integrated circuit during the standby period.

According to another aspect of the semiconductor integrated circuit of the present invention, the first and second conductive transistors are an nMOS (MOS: Metal-Oxide-Semiconductor) transistor and a pMOS transistor, respectively. The power control circuit applies a first and second transistor control signal to gates of the nMOS and pMOS transistors, respectively. The first transistor control signal is fixed to a high power supply voltage while the circuit block is in operation and is fixed to a ground voltage while the circuit block is not in operation. The high power supply voltage is higher than the power supply voltage and is supplied to a second actual power supply line. The second transistor control signal is fixed to the ground voltage while the circuit block is in operation and is fixed to the power supply voltage while the circuit block is not in operation.

Although the nMOS and pMOS transistors turn off while the circuit block is not in operation, a voltage (source voltage) at a connecting node between the nMOS and pMOS transistors gradually becomes an intermediate voltage between the power supply voltage and the ground voltage due to a very small leakage current. Meanwhile, gate voltages of the nMOS and pMOS transistors at this time are the ground voltage and the power supply voltage, respectively. Therefore, gate-source voltages of the nMOS and pMOS transistors at this time can be made to be a negative voltage and a positive voltage, respectively. As a result of this, the nMOS and pMOS transistors can be certainly turned off without preparing a special supply source of the negative voltage, so that the subthreshold currents can be suppressed. Therefore, it is possible to reduce the power consumption of the semiconductor integrated circuit during the standby period without increasing the product cost.

Further, since the first transistor control signal which is fixed to the high power supply voltage is applied on a gate of the nMOS transistor while the circuit block is in operation, increase in a power supply resistance can be kept to a minimum even when the nMOS transistor is added to a switch circuit which is constituted by being disposed between the first actual power supply line and the virtual power supply line.

According to another aspect of the semiconductor integrated circuit of the present invention, the power control circuit changes the first transistor control signal from the ground voltage to the high power supply voltage, and changes the second transistor control signal from the power supply voltage to the ground voltage, in response to activation of a circuit block control signal which is activated to cause the circuit block to operate. The power control circuit changes the first transistor control signal from the high power supply voltage to the ground voltage, and changes the second transistor control signal from the ground voltage to the power supply voltage, in response to deactivation of the circuit block control signal.

By using the circuit block control signal, it is possible to control conduction of the nMOS and pMOS transistors in conjunction with operation of the circuit block. In other words, the supply of the power supply voltage to the circuit block is controlled according to the operation of the circuit block.

According to another aspect of the semiconductor integrated circuit of the present invention, a level converter of the power control circuit converts an output voltage corresponding to a high logic level from the power supply voltage to the high power supply voltage.

By providing the level converter, the high level voltage of the first transistor control signal can be converted to the high power supply voltage with ease.

According to another aspect of the semiconductor integrated circuit of the present invention, a voltage step-down circuit steps down the high power supply voltage which is supplied to the second actual power supply line via an external power supply pin and supplies it to the first actual power supply line as the power supply voltage.

By providing the voltage step-down circuit, it becomes unnecessary to prepare two kinds of voltage supply sources. Thereby, increase in the product cost due to formation of the external power supply pin for supplying the power supply voltage and the like can be suppressed.

According to another aspect of the semiconductor integrated circuit of the present invention, backgates of the nMOS and pMOS transistors are connected to the ground line and the first actual power supply line, respectively.

The source voltage of the nMOS and pMOS transistors gradually becomes the intermediate voltage between the power supply voltage and the ground voltage while the circuit block is not in operation. Therefore, a backgate voltage of the nMOS transistor can be made lower than the source voltage only by making the backgate voltage (substrate voltage) of the nMOS transistor become the ground voltage. Moreover, a backgate voltage of the pMOS transistor can be made higher than the source voltage only by making the backgate voltage of the pMOS transistor become the power supply voltage. As a result of this, the subthreshold currents of the nMOS and pMOS transistors can be further suppressed without preparing the special supply source of the negative voltage. Therefore, it is possible to further reduce the power consumption of the semiconductor integrated circuit during the standby period, without increasing its product cost.

As described above, the backgate of the nMOS transistor which is disposed between the first actual power supply line and the virtual power supply line can be connected to the ground line, similarly to the other nMOS transistors. Therefore, the backgates of all the nMOS transistors constituting the semiconductor integrated circuit can be grounded commonly. Thus, it becomes unnecessary to electrically disconnect the backgate of the nMOS transistor which is disposed between the first actual power supply line and the virtual power supply line from the backgates of the other nMOS transistors. As a result of this, it is possible to reduce the power consumption of the semiconductor integrated circuit during the standby period without complicating its device structure (well structure).

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 10 is an explanatory view showing main performance of the semiconductor integrated circuit of the present invention and semiconductor integrated circuits of the comparative examples.

DESCRIPTION OF THE PREFERRED EMBODIMENTS

Hereinafter, preferred embodiments of the present invention will be explained with reference to the drawings.

Figure 1:
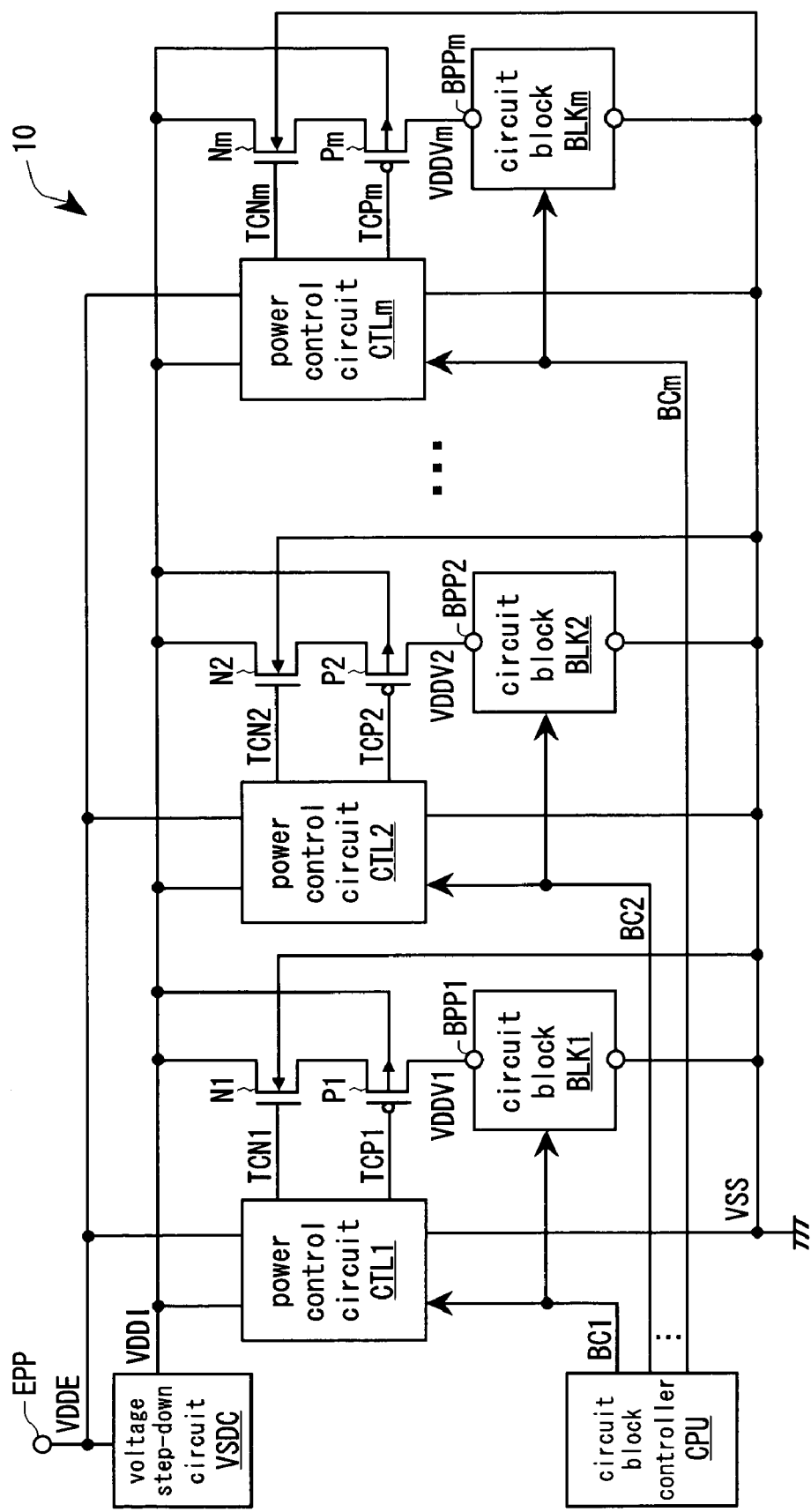
FIG. 1 is an explanatory view showing an embodiment of a semiconductor integrated circuit of the present invention.

FIG. 1 shows an embodiment of a semiconductor integrated circuit according to the present invention. In the following explanation, the same numerals and symbols as power supply lines are given to designate voltages supplied to the power supply lines.

A semiconductor integrated circuit 10 includes a voltage step-down circuit VSDC, a circuit block controller CPU, power control circuits CTL (CTL1 to CTLm), circuit blocks BLK (BLK1 to BLKm), nMOS transistors (first conductive transistors) N (N1 to Nm), pMOS transistors (second conductive transistors) P (P1 to Pm), a first actual power supply line VDDI, a second actual power supply line VDDE, virtual power supply lines VDDV (VDDV1 to VDDVm), and a ground line VSS. Incidentally, structures of the power control circuits CTL2 to CTLm, the circuit blocks BLK2 to BLKm, the nMOS transistors N2 to Nm, the pMOS transistors P2 to Pm, and the virtual power supply lines VDDV2 to VDDVm are the same as those of the power control circuit CTL1, the circuit block BLK1, the nMOS transistor N1, the pMOS transistor P1, and the virtual power supply line VDDV1, respectively, and fundamental operation thereof are also the same. Therefore, only the power control circuit CTL1, the circuit block BLK1, the nMOS transistor N1, the pMOS transistor P1, and the virtual power supply line VDDV1 will be explained in detail.

The voltage step-down circuit VSDC steps down a high power supply voltage VDDE (3 V) which is supplied to the second actual power supply line VDDE via an external power supply pin EPP, and supplies it to the first actual power supply line VDDI as a power supply voltage VDDI (1.5 V).

The circuit block controller CPU outputs a circuit block control signal BC1 which is activated to cause the circuit block BLK1 to operate to the power control circuit CTL1 and the circuit block BLK1. The circuit block control signal BC1 is activated to change from a ground voltage VSS (0 V) to the power supply voltage VDDI. The circuit block control signal BC1 is deactivated to change from the power supply voltage VDDI to the ground voltage VSS.

The circuit block BLK1 is a CMOS circuit which is constituted of MOS transistors having a low threshold value (|0.3 V|). The circuit block BLK1 starts its operation in synchronization with the activation (rising edge) of the circuit block control signal BC1, and stops its operation in synchronization with the deactivation (falling edge) of the circuit block control signal BC1.

The nMOS transistor N1 and the pMOS transistor P1 are connected in series between the first actual power supply line VDDI and the virtual power supply line VDDV1 which is connected to a power supply pin BPP1 of the circuit block BLK1. The nMOS transistor N1 has a high threshold value (0.6 V). A drain and backgate of the nMOS transistor N1 are respectively connected to the first actual power supply line VDDI and the ground line VSS. The pMOS transistor P1 has a low threshold value (−0.3 V). A drain and backgate of the pMOS transistor P1 are respectively connected to the virtual power supply line VDDV1 and the first actual power supply line VDDI. Further, sources of the nMOS transistor N1 and the pMOS transistor P1 are connected to each other. Instead of disposing a pMOS transistor having a high threshold value as in the conventional art, the pMOS transistor P1 having the low threshold value is connected to the nMOS transistor N1 having the high threshold value in series according to the semiconductor integrated circuit 10 of the present invention, so that on-state resistances of the nMOS transistor N1 and the pMOS transistor P1 are prevented from increasing, and off-state resistances thereof increase.

The power control circuit CTL1 outputs a first transistor control signal TCN1 and a second transistor control signal TCP1 to gates of the nMOS transistor N1 and the pMOS transistor P1, respectively. In synchronization with the activation (rising edge) of the circuit block control signal BC1, the power control circuit CTL1 changes the first transistor control signal TCN1 from the ground voltage VSS to the high power supply voltage VDDE, and changes the second transistor control signal TCP1 from the power supply voltage VDDI to the ground voltage VSS. In synchronization with the deactivation (falling edge) of the circuit block control signal BC1, the power control circuit CTL1 changes the first transistor control signal TCN1 from the high power supply voltage VDDE to the ground voltage VSS, and changes the second transistor control signal TCP1 from the ground voltage VSS to the power supply voltage VDDI. Namely, the power control circuit CTL1 turns on the nMOS transistor N1 and the pMOS transistor P1 while the circuit block BLK1 is in operation (active period), and turns off the nMOS transistor N1 and the pMOS transistor P1 while the circuit block BLK1 is not in operation (standby period). Therefore, the supply of the power supply voltage to the circuit block BLK1 is controlled in conjunction with the operation of the circuit block BLK1. Moreover, the first transistor control signal TCN1 which is fixed to the high power supply voltage VDDE is applied on the gate of the nMOS transistor N1 while the circuit block BLK1 is in operation, so that the on-resistance of the nMOS transistor N1 decreases and a power supply resistance is prevented from increasing.

Figure 2:
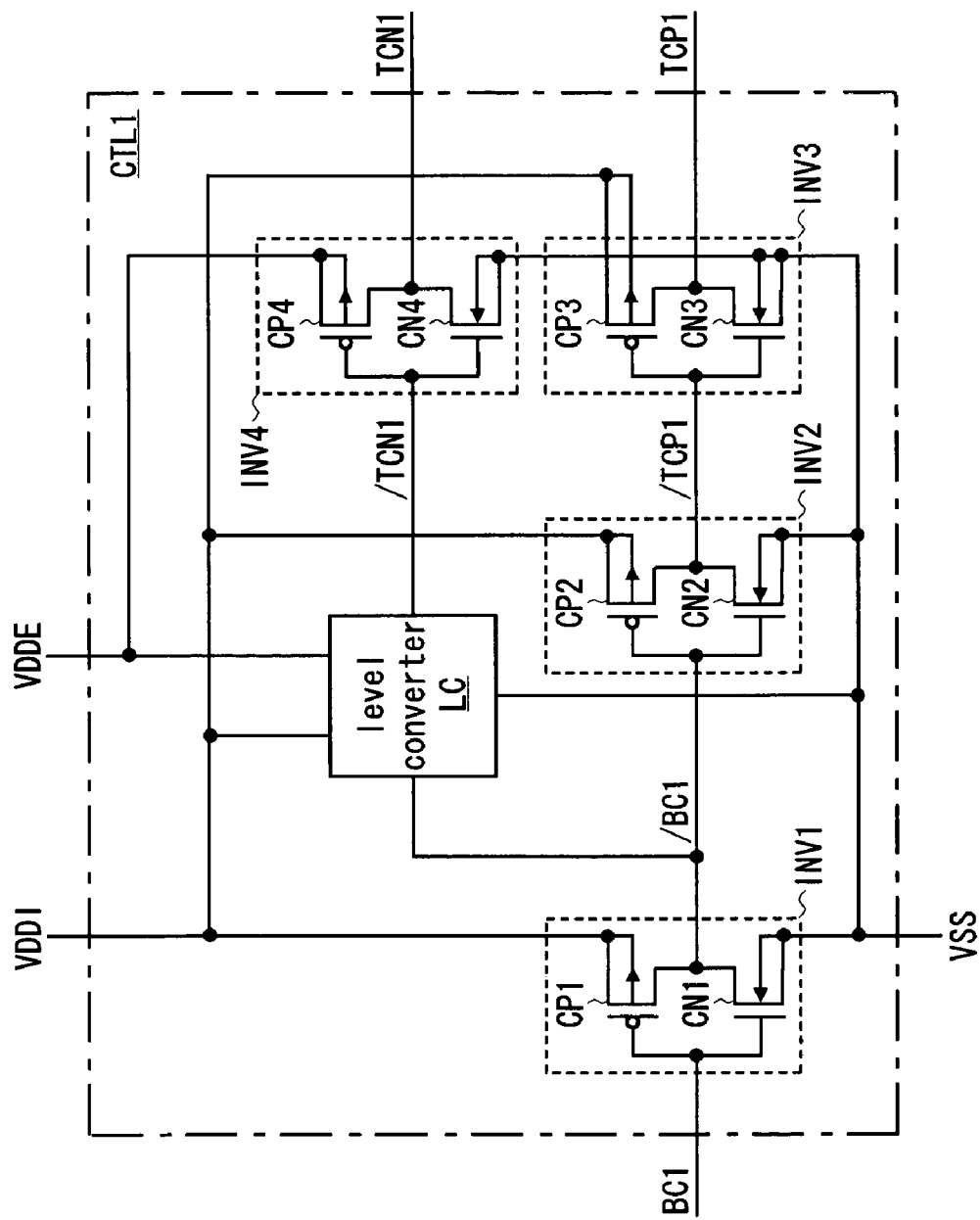
FIG. 2 is an explanatory view showing a power control circuit of FIG. 1 in detail.

FIG. 2 shows the power control circuit CTL1 of FIG. 1 in detail.

The power control circuit CTL1 is constituted of inverter circuits INV1 to INV4 and a level converter LC.

The inverter circuit INV1 is constituted of a pMOS transistor CP1 and an nMOS transistor CN1. The inverter circuit INV1 inverts the circuit block control signal BC1 which is outputted from the circuit block controller CPU (FIG. 1) and outputs it as an internal signal /BC1.

The inverter circuit INV2 is constituted of a pMOS transistor CP2 and an nMOS transistor CN2. The inverter circuit INV2 inverts the internal signal /BC1 and outputs it as an internal signal /TCP1.

The inverter circuit INV3 is constituted of a pMOS transistor CP3 and an nMOS transistor CN3. The inverter circuit INV3 inverts the internal signal /TCP1 and outputs it as the second transistor control signal TCP1 to the gate of the pMOS transistor P1 (FIG. 1). Thereby, the pMOS transistor P1 turns on while the circuit block BLK1 is in operation, and turns off while the circuit block BLK1 is not in operation.

The level converter LC converts a high level voltage of the internal signal /BC1 from the power supply voltage VDDI to the high power supply voltage VDDE and outputs it as an internal signal /TCN1.

The inverter circuit INV4 is constituted of a pMOS transistor CP4 and an nMOS transistor CN4. The inverter circuit INV4 inverts the internal signal /TCN1 and outputs it as the first transistor control signal TCN1 to the gate of the nMOS transistor N1 (FIG. 1). Thereby, the nMOS transistor N1 turns on while the circuit block BLK1 is in operation, and turns off while the circuit block BLK1 is not in operation.

Although the nMOS transistor N1 and the pMOS transistor P1 turn off while the circuit block BLK1 is not in operation, a voltage (source voltage) at a connecting node between the nMOS transistor N1 and the pMOS transistor P1 gradually becomes an intermediate voltage between the power supply voltage VDDI and the ground voltage VSS due to a very small leakage current. Meanwhile, gate voltages of the nMOS transistor N1 and the pMOS transistor P1 at this time are the ground voltage VSS and the power supply voltage VDDI, respectively. Therefore, a gate-source voltage of the nMOS transistor N1 becomes a negative voltage at this time. Further, a gate-source voltage of the pMOS transistor P1 becomes a positive voltage at this time. As a result of this, the nMOS transistor N1 and the pMOS transistor P1 certainly turn off without providing a special supply source of the negative voltage, so that subthreshold currents are suppressed.

Since the voltage (source voltage) at the connecting node between the nMOS transistor N1 and the pMOS transistor P1 gradually becomes the intermediate voltage between the power supply voltage and the ground voltage while the circuit block BLK1 is not in operation, a backgate voltage of the nMOS transistor N1 becomes lower than the source voltage only by grounding the backgate of the nMOS transistor N1. Moreover, a backgate voltage of the pMOS transistor P1 becomes higher than the source voltage only by connecting the backgate of the pMOS transistor P1 to the first actual power supply line VDDI. Therefore, threshold voltages of the nMOS transistor N1 and the pMOS transistor P1 become higher without providing the special supply source of the negative voltage. As a result of this, the subthreshold currents of the nMOS transistor N1 and the pMOS transistor P1 are further suppressed.

As described above, the structures of the power control circuits CTL2 to CTLm, the circuit blocks BLK2 to BLKm, the nMOS transistors N2 to Nm, the pMOS transistors P2 to Pm, and the virtual power supply lines VDDV2 to VDDVm are the same as those of the power control circuit CTL1, the circuit block BLK1, the nMOS transistor N1, the pMOS transistor P1, and the virtual power supply line VDDV1, respectively, and the fundamental operation thereof are also the same. Therefore, in the semiconductor integrated circuit 10, the power supply voltage VDDI is supplied only to the circuit block BLK corresponding to the activated circuit block control signal BC. Since the supply of the power supply voltage VDDI to the circuit blocks BLK which are not in operation is interrupted, power consumption of the semiconductor integrated circuit 10 is reduced. As described above, since the subthreshold currents of the nMOS transistor N1 and the pMOS transistor P1 are suppressed, the power consumption of the semiconductor integrated circuit 10 particularly during the standby period (period when none of the circuit blocks BLK are in operation) is substantially reduced.

Figure 3:
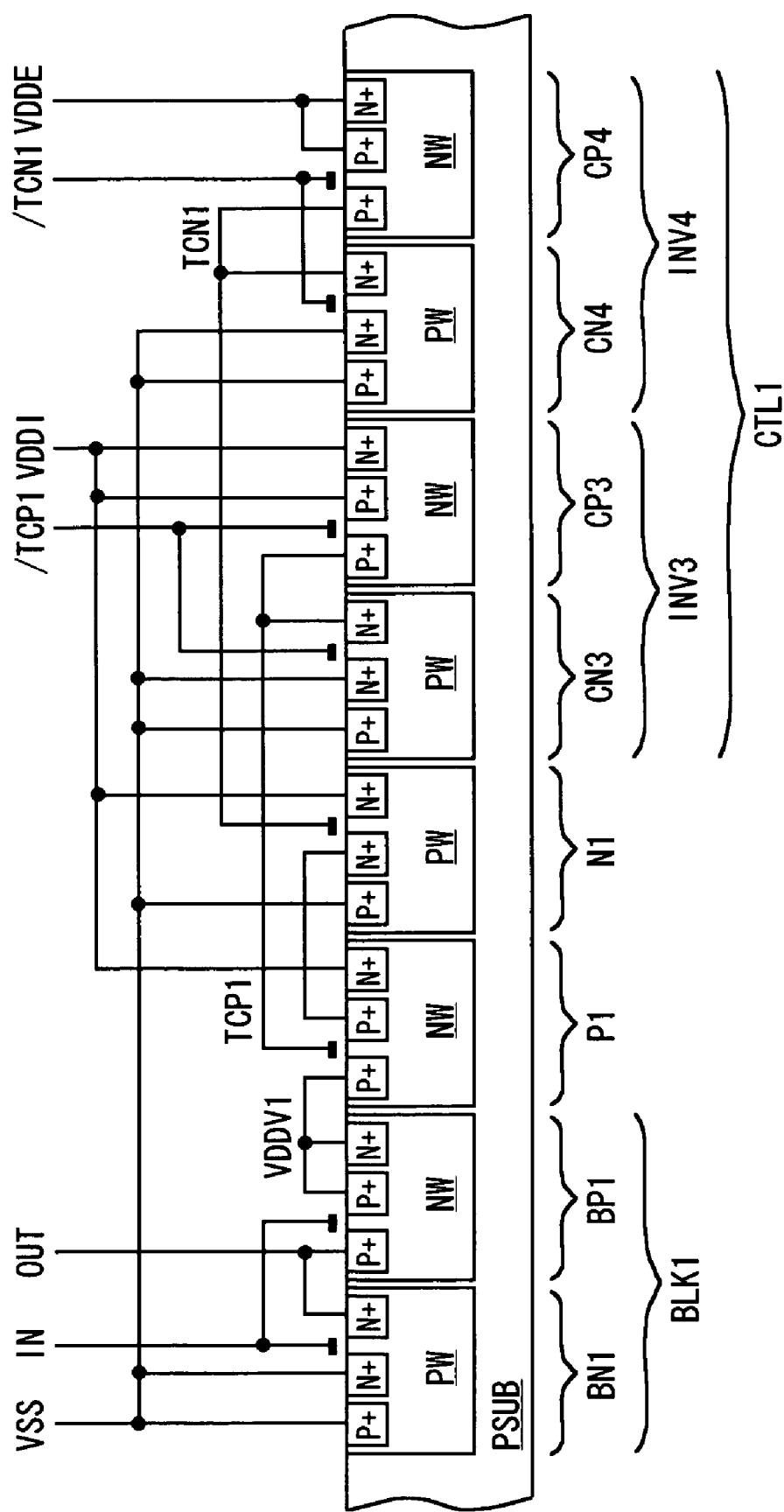
FIG. 3 is an explanatory view showing a part of the cross-structural structure of FIG. 1.

FIG. 3 shows a part of the cross-sectional structure of FIG. 1.

In a p-type substrate PSUB, n-type wells NW are formed by doping an n-type impurity, and p-type wells PW are formed by doping a p-type impurity. The source and drain of the nMOS transistor (both are on an N+ layer) are formed by doping the n-type impurity into the p-type well PW. The backgate of the nMOS transistor (P+ layer) is formed by doping the p-type impurity into the p-type well PW. The source and drain of the pMOS transistor (both are on the P+ layer) are formed by doping the p-type impurity into the n-type well NW. The backgate of the pMOS transistor (N+ layer) is formed by doping the n-type impurity into the n-type well NW. The gates of the nMOS and pMOS transistors (black quadrangles in the drawing) are formed above channel areas between the sources and the drains with an oxide film (not shown) therebetween.

The backgate of the nMOS transistor N1 is connected to the common ground line VSS, similarly to the nMOS transistors CN3, CN4 and BN1. Therefore, it becomes unnecessary to electrically disconnect the backgate of the nMOS transistor N1 from the backgates of the nMOS transistors CN3, CN4 and BN1. Therefore, the semiconductor integrated circuit 10 is realized by simple twin-well structure.

Next, explanation of circuits which are studied by the inventor before the present invention will be given.

Figure 4:
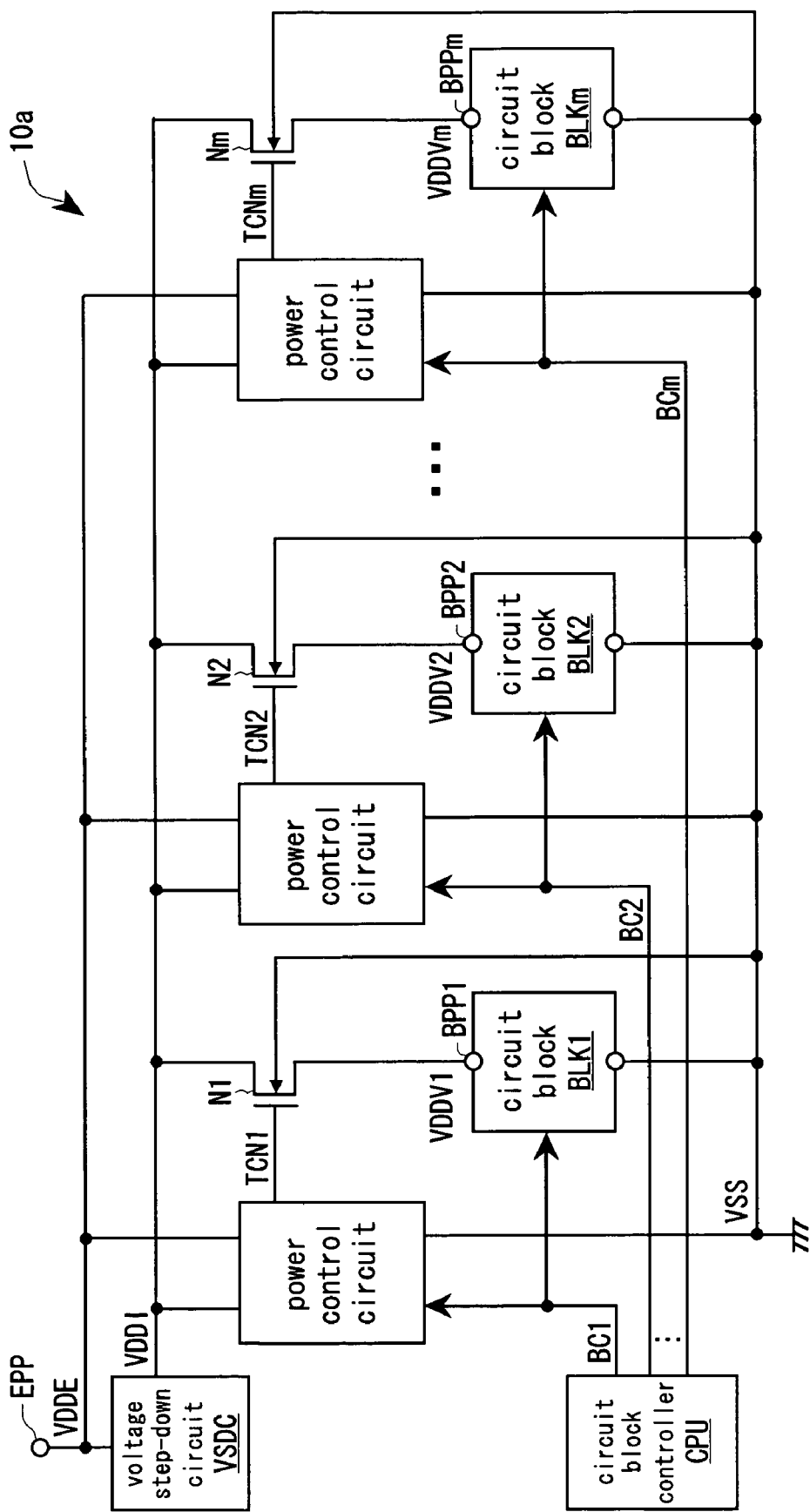
FIG. 4 is an explanatory view showing a first comparative example.
Figure 5:
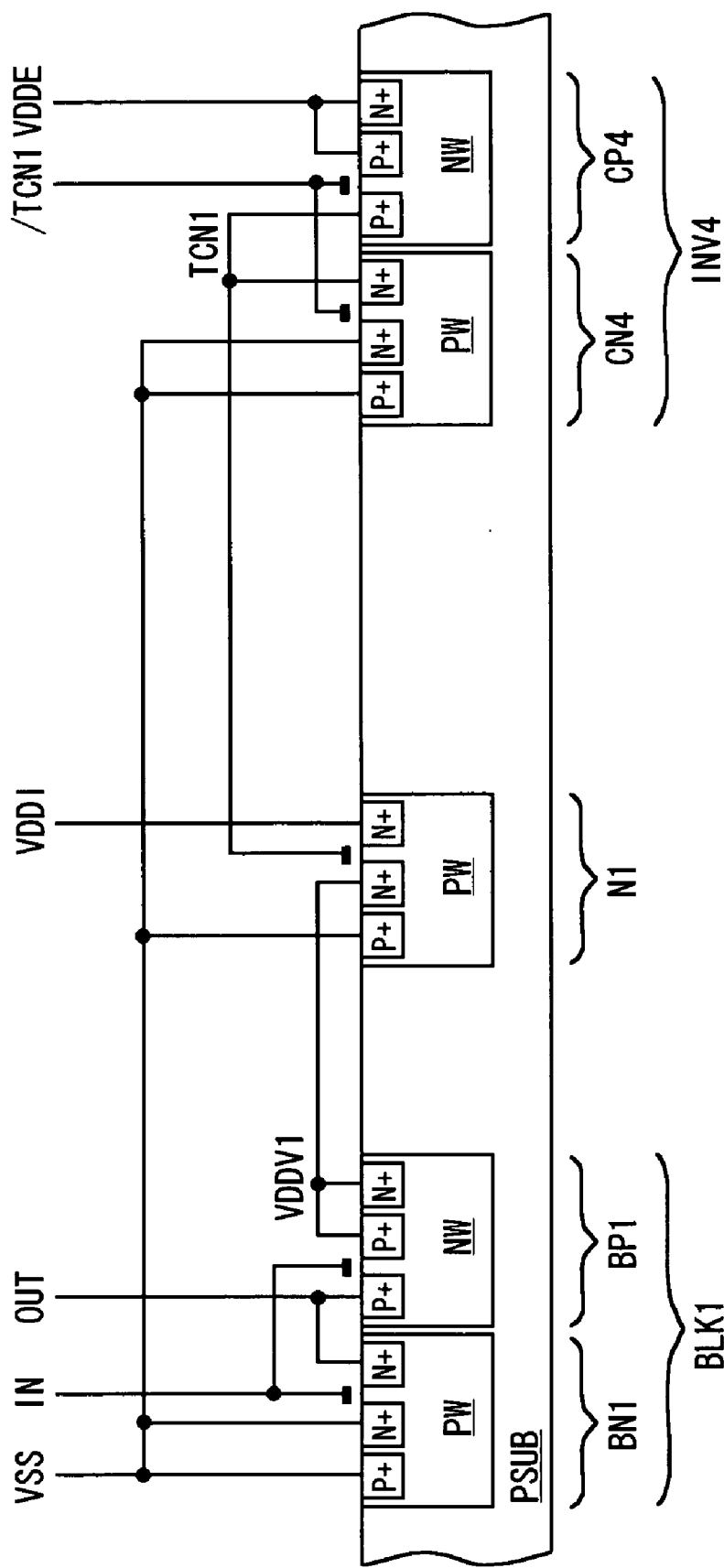
FIG. 5 is an explanatory view showing a part of the cross-structural structure of FIG. 4.
Figure 6:
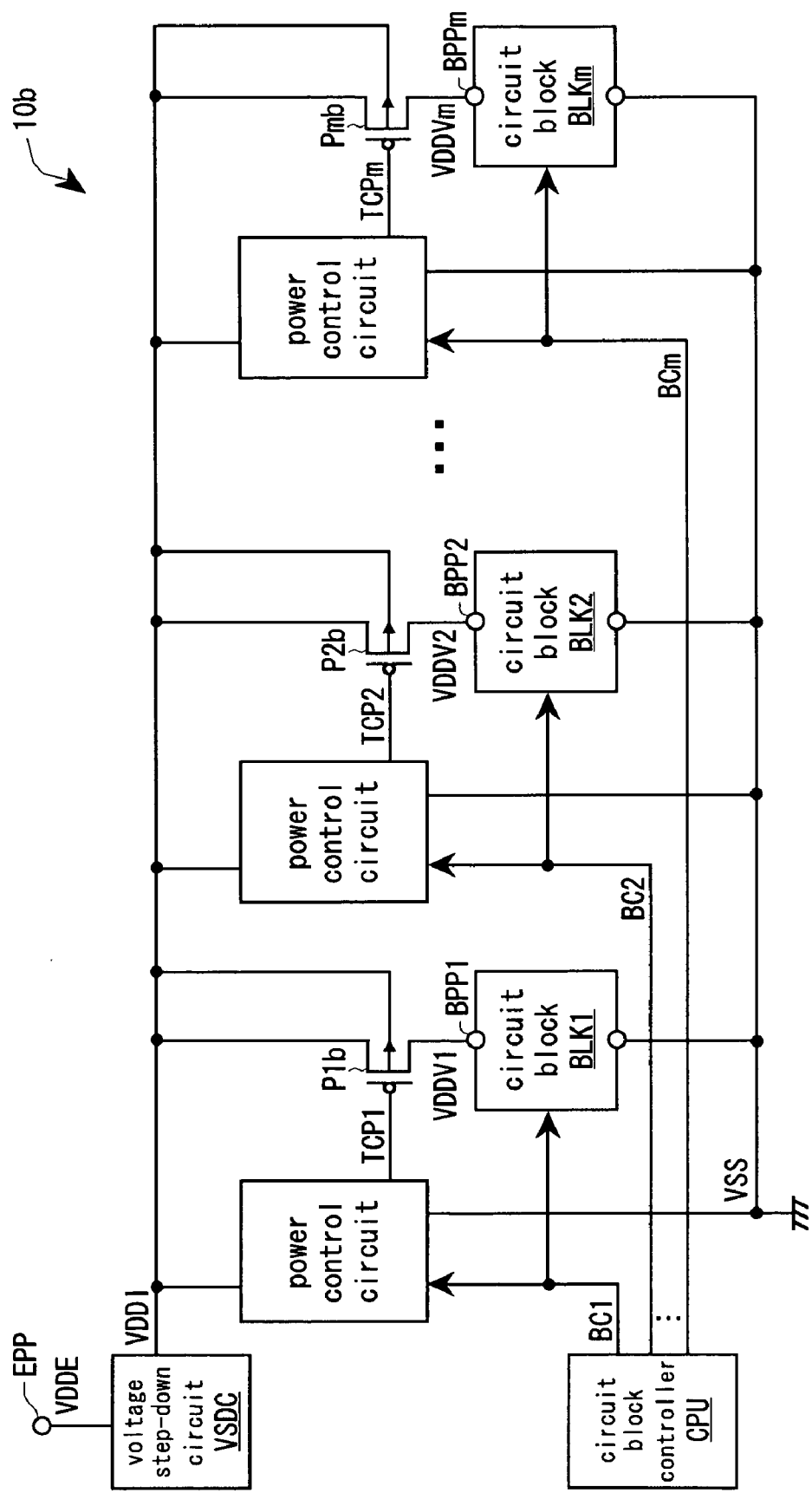
FIG. 6 is an explanatory view showing a second comparative example.
Figure 7:
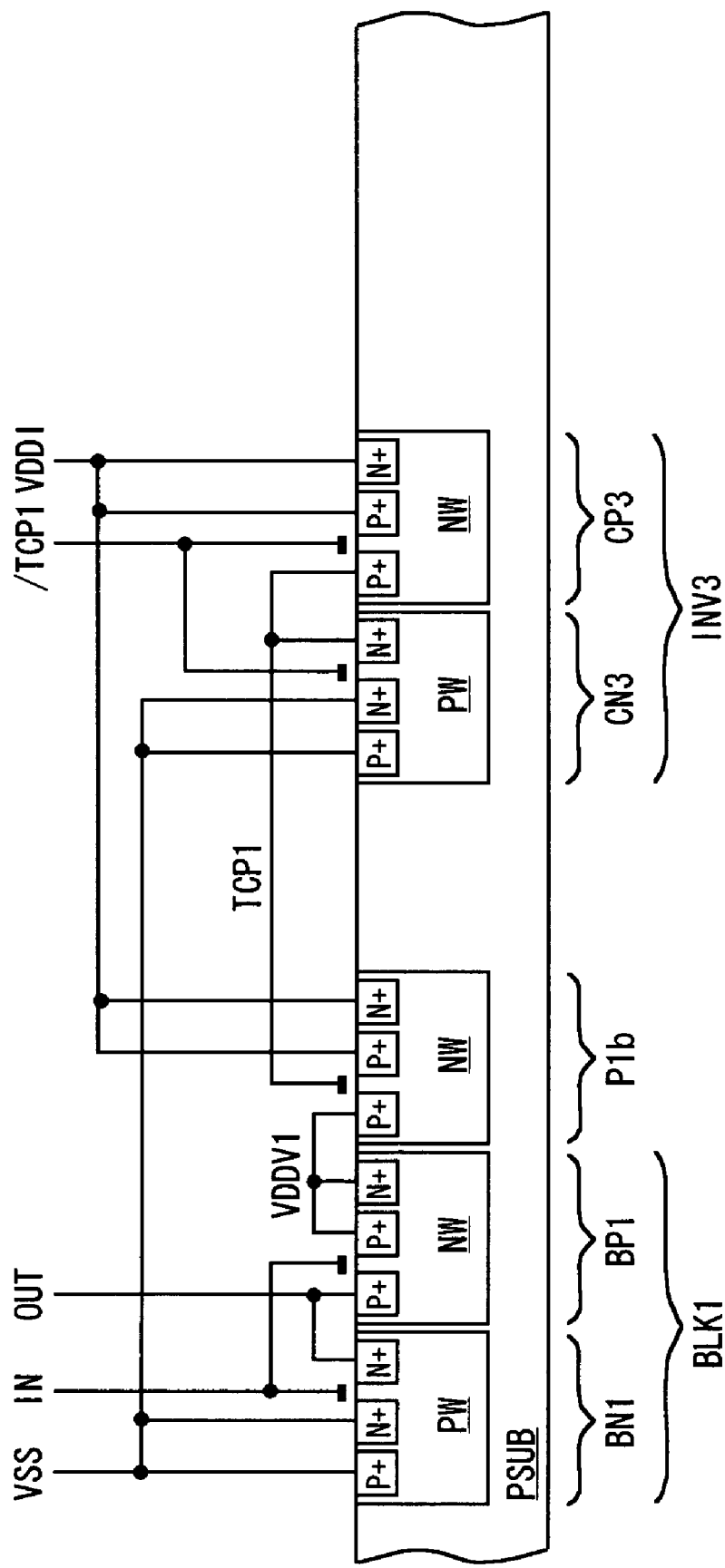
FIG. 7 is an explanatory view showing a part of the cross-structural structure of FIG. 6.
Figure 8:
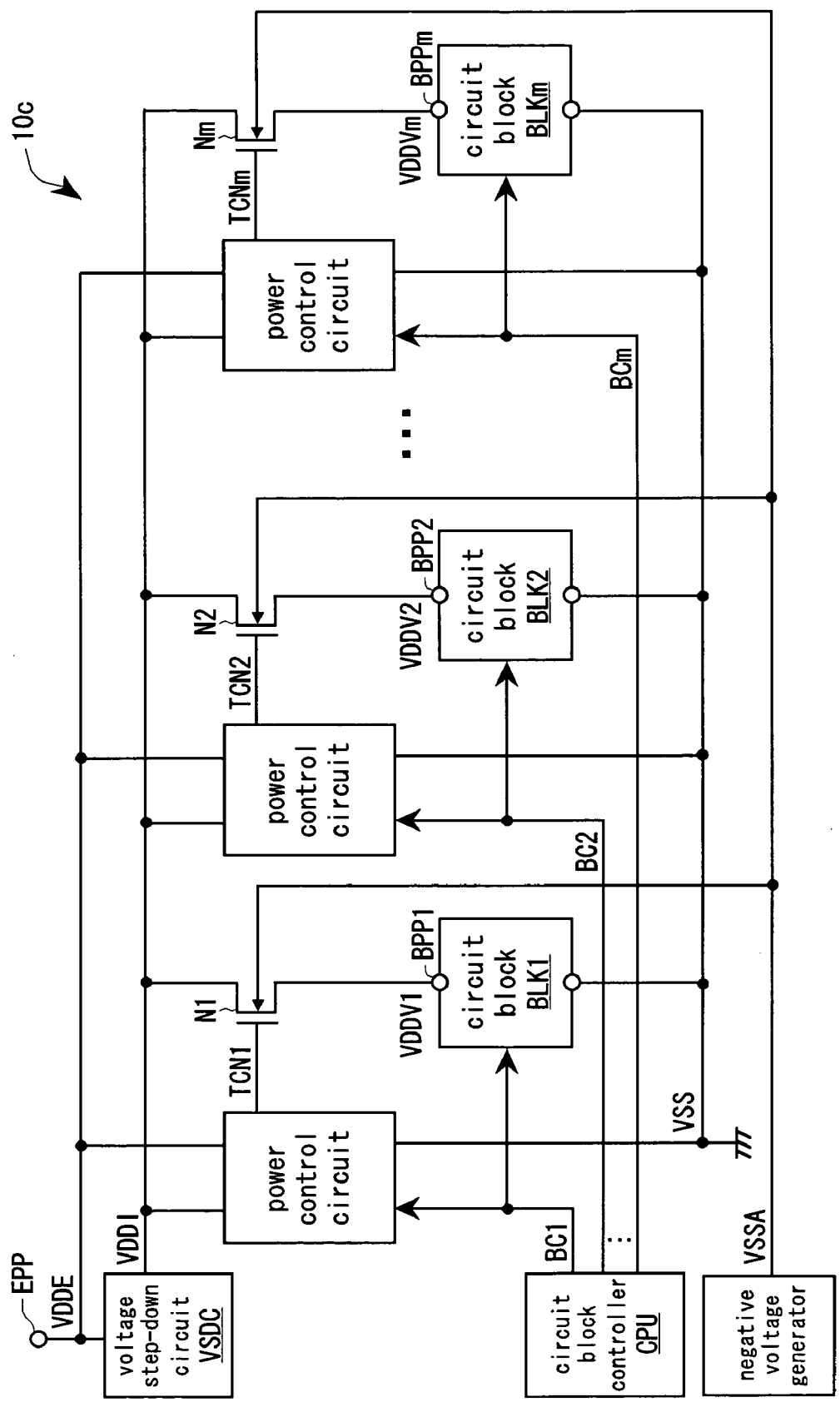
FIG. 8 is an explanatory view showing a third comparative example.
Figure 9:
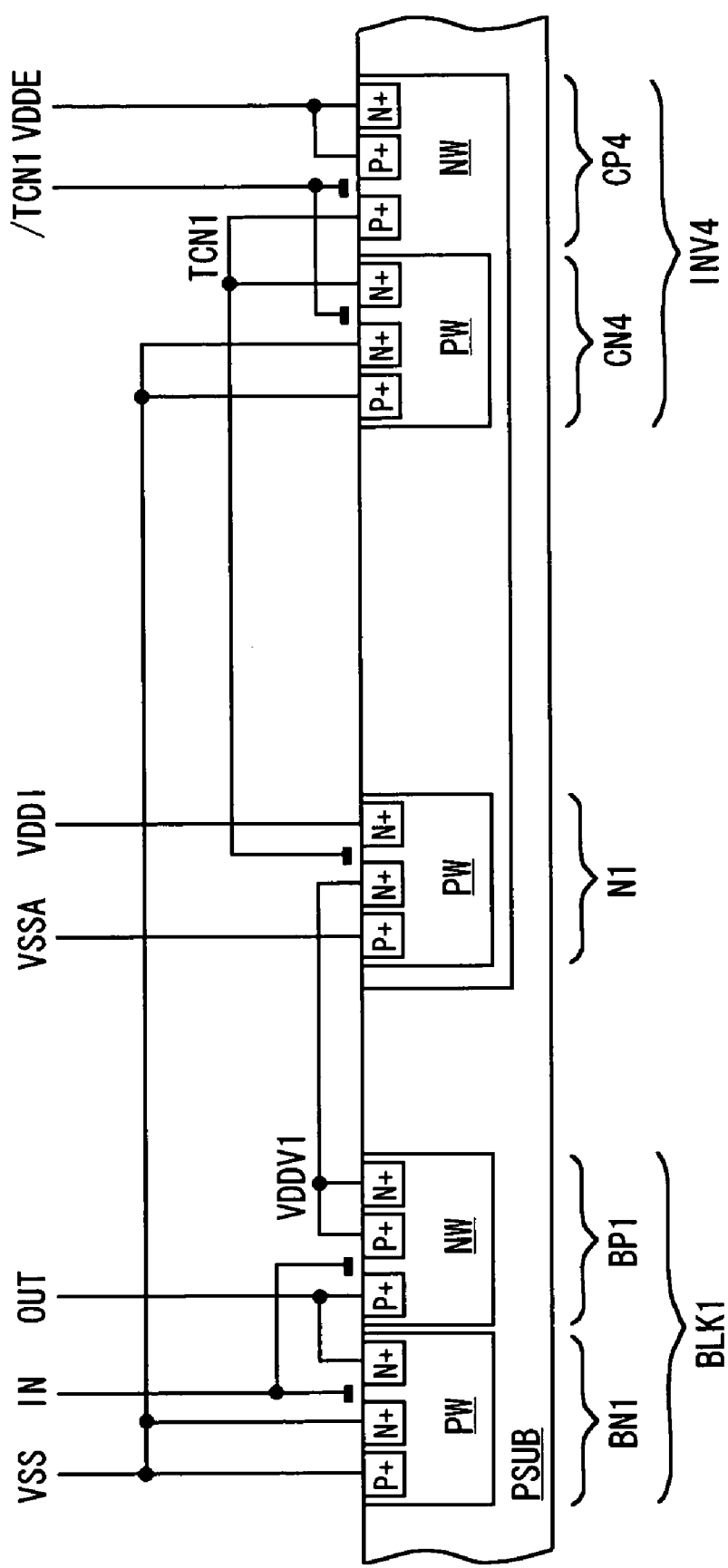
FIG. 9 is an explanatory view showing a part of the cross-structural structure of FIG. 8.

FIG. 4 shows an example (first comparative example) in which only nMOS transistors N (N1 to Nm) are disposed between a first actual power supply line VDDI and virtual power supply lines VDDV (VDDV1 to VDDVm), respectively. FIG. 5 shows a part of the cross-sectional structure of FIG. 4. FIG. 6 shows an example (second comparative example) in which only pMOS transistors Pb (P1b to Pmb) having a high threshold value (−0.5 V) are disposed between a first actual power supply line VDDI and virtual power supply lines VDDV (VDDV1 to VDDVm), respectively. FIG. 7 shows a part of the cross-sectional structure of FIG. 6. FIG. 8 shows an example (third comparative example) in which the negative voltage is applied on backgates of the nMOS transistors N (N1 to Nm) of FIG. 4. FIG. 9 shows a part of the cross-sectional structure of FIG. 8. Incidentally, the same numerals and symbols are given to designate the same elements as those explained in FIG. 1 to FIG. 3, and detailed explanations thereof will be omitted. The circuits shown in FIGS. 4, 5, 8 and 9 are not yet publicly known.

In FIG. 4, when the nMOS transistor N1 turns off, a source voltage of the nMOS transistor N1 gradually becomes equal to a ground voltage VSS due to a very small leakage current of a circuit block BLK1. Therefore, it is impossible to make a gate-source voltage of the nMOS transistor N1 become the negative voltage during a standby period of the circuit block BLK1. Similarly, it is impossible to make the backgate of the nMOS transistor N1 become lower than the source voltage. As a result of this, suppressing effect of a subthreshold current of the nMOS transistor N1 is lessened.

In FIG. 6, a source voltage of a pMOS transistor P1b is a power supply voltage VDDI at all times, and hence it is impossible to make a gate-source voltage of the pMOS transistor P1b become the positive voltage during a standby period of a circuit block BLK1. Similarly, it is impossible to make a backgate of the pMOS transistor P1b become higher than the source voltage. As a result of this, suppressing effect of a subthreshold current of the pMOS transistor P1 is lessened.

In FIG. 8, when an nMOS transistor N1 turns off, a source voltage of the nMOS transistor N1 gradually becomes equal to a ground voltage VSS due to a very small leakage current of a circuit block BLK1. Therefore, it is impossible to make a gate-source voltage of the nMOS transistor N1 become the negative voltage during a standby period of the circuit block BLK1. As a result of this, suppressing effect of a subthreshold current of the nMOS transistor N1 is lessened.

Moreover, a backgate of the nMOS transistor N1 is connected to a supply line VSSA of the negative voltage supplied from a negative voltage generator. Therefore, a backgate voltage of the nMOS transistor N1 becomes lower than the source voltage when the nMOS transistor N1 turns off. However, the product cost increases because the special supply source of the negative voltage is required.

In FIG. 9, the backgate of the nMOS transistor N1 is connected to the supply line VSSA of the negative voltage. In order to prevent current leakage from the ground line VSS to the supply line VSSA of the negative voltage, it is necessary to electrically disconnect the backgate of the nMOS transistor N1 from backgates of nMOS transistors CN4 and BN1. Therefore, a semiconductor integrated circuit 10c requires triple-well structure which separates p-type wells PW of the nMOS transistor N1 from a substrate PSUB. As a result of this, its product cost increases.

FIG. 10 shows main performance of the semiconductor integrated circuit 10 of the present invention and the semiconductor integrated circuits 10a, 10b and 10c shown in FIG. 4, FIG. 6, and FIG. 8. The on-state current (or the off-state current) is a current value (simulation) when the MOS transistor(s) which is/are disposed between the first actual power supply line VDDI and the virtual power supply line VDDV turn(s) on (or off). In the table, the on-state current and the off-state current show relative values assuming the worst value in the first comparative example to be 1. The size of the MOS transistor(s) (channel length and channel width) which is/are disposed between the first actual power supply line VDDI and the virtual power supply line VDDV is all the same.

As shown in FIG. 10, when comparing the semiconductor integrated circuit 10 of the present invention in which the pMOS transistor is used as a switching element disposed between the first actual power supply line VDDI and the virtual power supply line VDDV with the semiconductor integrated circuit 10b of the second comparative example, the on-state current of the semiconductor integrated circuit 10 of the present invention can be doubled as compared with the semiconductor integrated circuit 10b of the second comparative example. In other words, it is possible to keep the increase in the on-state resistance of the MOS transistors which are disposed between the first actual power supply line VDDI and the virtual power supply line VDDV to a minimum. Moreover, according to the semiconductor integrated circuit 10 of the present invention, the off-state current (subthreshold current) can be substantially reduced as compared with the semiconductor integrated circuits 10a, 10b and 10c of the first to third comparative examples. Namely, it is possible to substantially reduce the power consumption of the semiconductor integrated circuit 10 during the standby period. Furthermore, since the semiconductor integrated circuit 10 of the present invention can be realized by the simple twin-well structure, and does not require the supply source of the negative voltage, it is possible to keep the increase in the product cost to a minimum.

The following effects can be produced according to the above-described embodiment.

Since the nMOS transistor N and the pMOS transistor P turn off while the circuit block BLK is not in operation, the supply of the power supply voltage to the circuit block BLK is interrupted. Therefore, it is possible to reduce the power consumption of the semiconductor integrated circuit 10 during the standby period. Further, since the pMOS transistor P having the low threshold value is connected in series to the nMOS transistor N having the high threshold value, the increase in the on-state resistances of the nMOS transistor N and the pMOS transistor P can be kept to a minimum, and the off-state resistances thereof can be increased. Therefore, it is possible to further suppress the subthreshold currents of the nMOS transistor N and the pMOS transistor P. As a result of this, it is possible to further reduce the power consumption of the semiconductor integrated circuit 10 during the standby period.

Since the source voltage of the nMOS transistor N and the pMOS transistor P gradually becomes the intermediate voltage between the power supply voltage and the ground voltage while the circuit block BLK is not in operation, it is possible to make the gate-source voltages of the nMOS transistor N and the pMOS transistor P become the negative voltage and the positive voltage, respectively. Therefore, the nMOS transistor N and the pMOS transistor P can be certainly turned off without preparing the special supply source of the negative voltage, so that the subthreshold currents can be suppressed. As a result of this, it is possible to reduce the power consumption of the semiconductor integrated circuit 10 during the standby period without increasing the product cost.

Since the first transistor control signal TCN which is fixed to the high power supply voltage VDDE is applied on the gate of the nMOS transistor N while the circuit block BLK is in operation, it is possible to keep the increase in the power supply resistance to a minimum even when the nMOS transistor N is added to a switch circuit which is constituted by being disposed between the first actual power supply line VDDI and the virtual power supply line VDDV.

By using the circuit block control signal BC, it is possible to control the conduction of the nMOS transistor N and the pMOS transistor P in conjunction with the operation of the circuit block BLK1. In other words, the supply of the power supply voltage VDDI to the circuit block BLK can be controlled according to the operation of the circuit block BLK.

By providing the level converter LC, the high level voltage of the first transistor control signal TCN can be converted to the high power supply voltage VDDE with ease.

By providing the voltage step-down circuit VSDC, it becomes unnecessary to prepare two kinds of voltage supply sources. Therefore, the increase in the product cost due to the formation of the external power supply pin for supplying the power supply voltage VDDI and the like can be suppressed.

Since the source voltage of the nMOS transistor N and the pMOS transistor P gradually becomes the intermediate voltages between the power supply voltage and the ground voltage while the circuit block BLK is not in operation, it is possible to make the backgate voltage of the nMOS transistor N become lower than the source voltage only by making the backgate voltage of the nMOS transistor N become the ground voltage VSS. Further, it is possible to make the backgate voltage of the pMOS transistor P become higher than the source voltage only by making the backgate voltage of the pMOS transistor P become the power supply voltage VDDI. As a result of this, the subthreshold currents of the nMOS transistor N and the pMOS transistor P can be further suppressed without preparing the special supply source of the negative voltage. Therefore, it is possible to further reduce the power consumption of the semiconductor integrated circuit 10 during the standby period without increasing its product cost.

The backgate of the nMOS transistor N can be connected to the ground line similarly to the other nMOS transistors. Therefore, the backgates of all the nMOS transistors constituting the semiconductor integrated circuit 10 can be grounded commonly. Thus, it becomes unnecessary to electrically disconnect the backgate of the nMOS transistor N from the backgates of the other nMOS transistors. As a result of this, it is possible to reduce the power consumption of the semiconductor integrated circuit 10 during the standby period without complicating its device structure (well structure).

Incidentally, in the above-described embodiment, the example of supplying the circuit block control signals BC (BC1 to BCm) from the circuit block controller CPU is explained. The present invention is not limited to such an embodiment. For example, signals which are supplied via the external signal pin to control the operation of the circuit blocks BLK (BLK1 to BLKm) from the exterior may be used as the circuit block control signals BC (BC1 to BCm).

The invention is not limited to the above embodiments and various modifications may be made without departing from the spirit and scope of the invention. Any improvement may be made in part or all of the components.

What is claimed is:
1. A semiconductor integrated circuit comprising:
   a circuit block constituted of transistors having a low threshold value;
   a first actual power supply line supplying a power supply voltage;

a virtual power supply line connected to a power supply pin of said circuit block;

a first conductive transistor having a high threshold value and a second conductive transistor having the opposite polarity to said first conductive transistor and a low threshold value, which are connected in series between said first actual power supply line and said virtual power supply line; and a power control circuit turning on said first and second conductive transistors while said circuit block is in operation and turning off said first and second conductive transistors while said circuit block is not in operation.

2. The semiconductor integrated circuit according to claim 1, further comprising a second actual power supply line supplying a high power supply voltage being higher than the power supply voltage, wherein:

said first conductive transistor is an nMOS transistor;

said second conductive transistor is a pMOS transistor;

said power control circuit applies a first transistor control signal, which is fixed to the high power supply voltage while said circuit block is in operation and is fixed to a ground voltage while said circuit block is not in operation, on a gate of said nMOS transistor; and said power control circuit applies a second transistor control signal, which is fixed to the ground voltage while said circuit block is in operation and is fixed to the power supply voltage while said circuit block is not in operation, on a gate of said pMOS transistor.

3. The semiconductor integrated circuit according to claim 2, wherein:

said power control circuit changes the first transistor control signal from the ground voltage to the high power supply voltage, and changes the second transistor control signal from the power supply voltage to the ground voltage, in response to activation of a circuit block control signal which is activated to cause said circuit block to operate; and said power control circuit changes the first transistor control signal from the high power supply voltage to the ground voltage, and changes the second transistor control signal from the ground voltage to the power supply voltage, in response to deactivation of the circuit block control signal.

4. The semiconductor integrated circuit according to claim 2, wherein said power control circuit includes a level converter converting an output voltage corresponding to a high logic level from the power supply voltage to the high power supply voltage.

5. The semiconductor integrated circuit according to claim 2, further comprising:

a voltage step-down circuit stepping down the high power supply voltage and supplying the stepped-down voltage to said first actual power supply line as the power supply voltage, wherein the high power supply voltage is supplied to said second actual power supply line via an external power supply pin.

6. The semiconductor integrated circuit according to claim 2, wherein:

a backgate of said nMOS transistor is connected to the ground line; and a backgate of said pMOS transistor is connected to said first actual power supply line.

* * * * *